US012628366B2

(12) United States Patent
Yang et al.

(10) Patent No.: US 12,628,366 B2
(45) Date of Patent: May 12, 2026

(54) SEMICONDUCTOR DEVICE AND METHOD FOR FABRICATING THE SAME

(71) Applicant: UNITED MICROELECTRONICS CORP., Hsin-Chu City (TW)

(72) Inventors: Chih-Wei Yang, Tainan City (TW); Ssu-I Fu, Kaohsiung City (TW); Chih-Kai Hsu, Tainan City (TW); Chun-Hsien Lin, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 489 days.

(21) Appl. No.: 18/105,798

(22) Filed: Feb. 3, 2023

(65) Prior Publication Data
US 2024/0204085 A1      Jun. 20, 2024

(30) Foreign Application Priority Data
Dec. 19, 2022     (CN) .......................... 202211631490.6

(51) Int. Cl.
| | |
|---|---|
| *H10D 30/01* | (2025.01) |
| *H01L 21/02* | (2006.01) |
| *H10D 30/62* | (2025.01) |
| *H10D 64/27* | (2025.01) |

(52) U.S. Cl.
CPC ... *H10D 30/0243* (2025.01); *H01L 21/02293* (2013.01); *H10D 30/62* (2025.01); *H10D 64/311* (2025.01)

(58) Field of Classification Search
CPC ............... H10D 30/0243; H10D 30/62; H10D 64/311; H10D 84/0193; H10D 84/038; H10D 84/853; H10D 84/856; H01L 21/02293; H01L 21/76229
See application file for complete search history.

(56) References Cited

U.S. PATENT DOCUMENTS

| | | | |
|---|---|---|---|
| 7,554,110 B2 | 6/2009 | Yu et al. | |
| 10,090,410 B1 | 10/2018 | Chi et al. | |
| 2008/0093700 A1* | 4/2008 | Huang ................... | H10D 84/83 257/E29.054 |
| 2014/0001561 A1* | 1/2014 | Cheng ................ | H10D 84/0186 257/369 |
| 2023/0260994 A1* | 8/2023 | Jong ................. | H10D 84/8312 |

OTHER PUBLICATIONS

Hsu, the specification, including the claims, and drawings in the U.S. Appl. No. 17/668,393 , filed Feb. 10, 2022.

* cited by examiner

*Primary Examiner* — Mohammad A Rahman
(74) *Attorney, Agent, or Firm* — Winston Hsu

(57) ABSTRACT

A method for fabricating a semiconductor device includes the steps of providing a substrate having a high-voltage (HV) region and a low-voltage (LV) region, forming a HV device on the HV region, and forming a LV device on the LV region. Preferably, the HV device includes a first gate structure on the substrate and a first epitaxial layer adjacent to the first gate structure, in which a top surface of the first epitaxial layer includes a first V-shape. The LV device includes a second gate structure on the substrate and a second epitaxial layer adjacent to the second gate structure, in which a top surface of the second epitaxial layer includes a first planar surface.

14 Claims, 13 Drawing Sheets

SEMICONDUCTOR DEVICE AND METHOD FOR FABRICATING THE SAME

BACKGROUND OF THE INVENTION

1. Field of the Invention

The invention relates to a method of fabricating semiconductor device, and more particularly to a method of integrating high-voltage (HV) device, medium-voltage (MV) device, and low-voltage (LV) device.

2. Description of the Prior Art

In current semiconductor processing, controllers, memories, circuits of low-voltage operation and power devices of high-voltage operation are largely integrated into a single chip to achieve a single-chip system. The power device, such as vertical double-diffusion metal-oxide-semiconductor (VDMOS), insulated gate bipolar transistor (IGBT) and lateral diffusion MOS (LDMOS), is employed to increase power switching efficiency and decrease the loss of energy resources. It is often required that the switching transistors withstand high breakdown voltages and operate at a low on-resistance.

Moreover with the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However as the scale of current devices continue to decrease the integration of high-voltage devices and FinFET devices start to face numerous challenges such as current leakage and control of breakdown voltage. Hence, how to improve the current fabrication for improving performance of the device has become an important task in this field.

SUMMARY OF THE INVENTION

According to an embodiment of the present invention, a method for fabricating a semiconductor device includes the steps of providing a substrate having a high-voltage (HV) region and a low-voltage (LV) region, forming a HV device on the HV region, and forming a LV device on the LV region. Preferably, the HV device includes a first gate structure on the substrate and a first epitaxial layer adjacent to the first gate structure, in which a top surface of the first epitaxial layer includes a first V-shape. The LV device includes a second gate structure on the substrate and a second epitaxial layer adjacent to the second gate structure, in which a top surface of the second epitaxial layer includes a first planar surface.

According to another aspect of the present invention, a semiconductor device includes a substrate having a high-voltage (HV) region and a low-voltage (LV) region, a HV device on the HV region, and a LV device on the LV region. Preferably, the HV device includes a first gate structure on the substrate and a first epitaxial layer adjacent to the first gate structure, in which a top surface of the first epitaxial layer includes a V-shape. The LV device includes a second gate structure on the substrate and a second epitaxial layer adjacent to the second gate structure, in which a top surface of the second epitaxial layer comprises a first planar surface.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
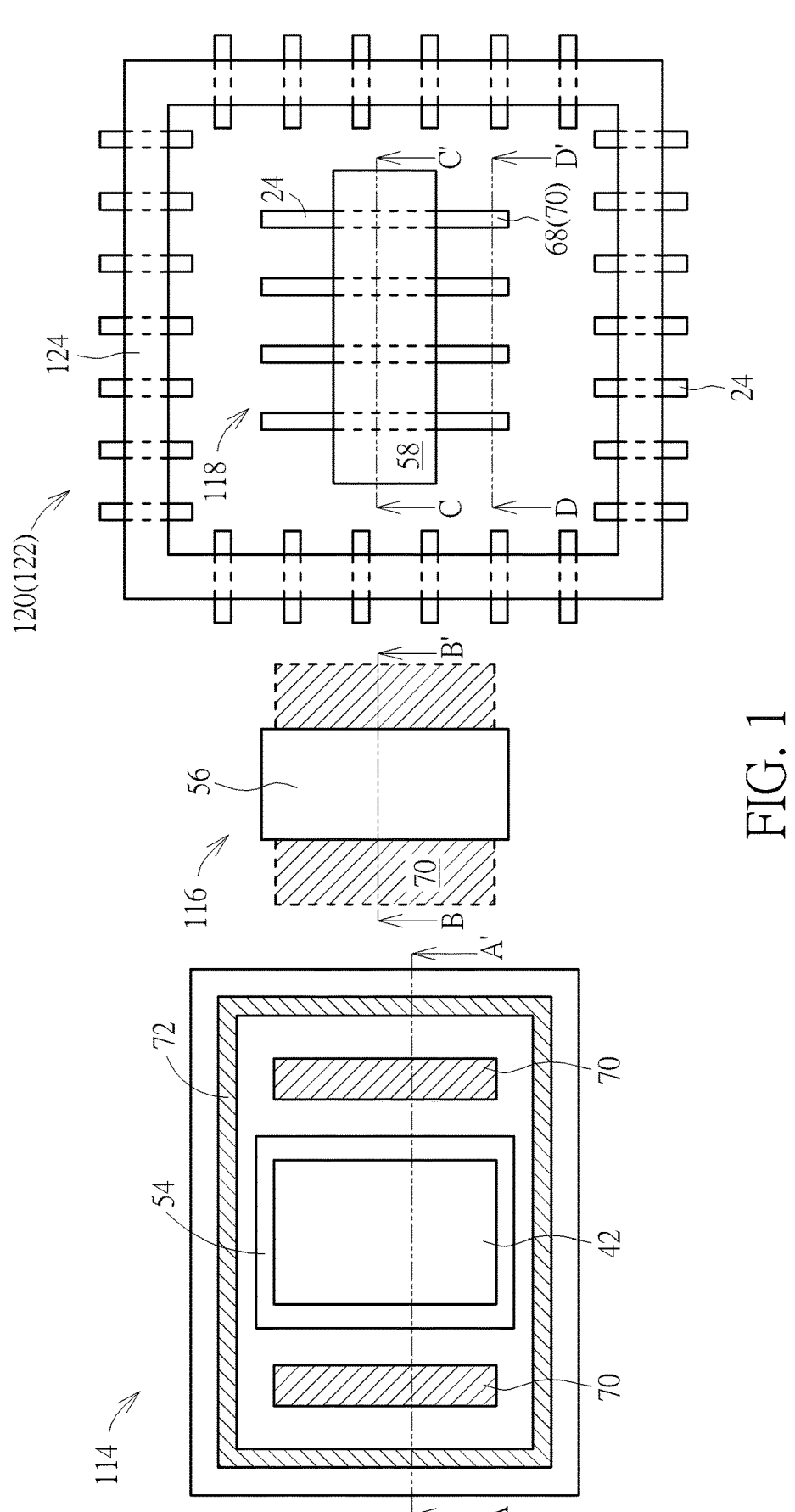
FIGS. 1-11 illustrate a method for fabricating a semiconductor device according to an embodiment of the present invention.
Figure 2:
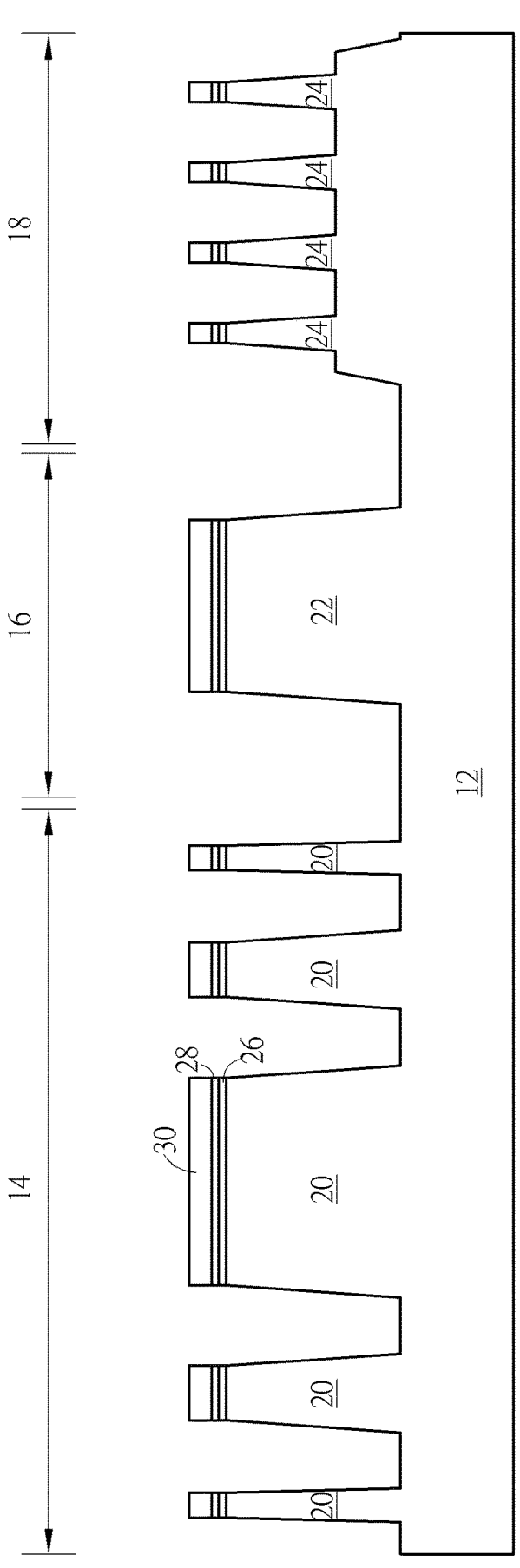

Referring to FIGS. 1-11, FIGS. 1-11 illustrate a method for fabricating a semiconductor device according to an embodiment of the present invention, in which FIG. 1 illustrates a top view for fabricating the semiconductor device according to an embodiment of the present invention and FIGS. 2-11 illustrate cross-section views for fabricating the semiconductor device along the sectional lines AA', BB', and CC'. As shown in FIGS. 1-2, a substrate 12 such as a silicon substrate or silicon-on-insulator (SOI) substrate is provided and three or more transistor regions including a high voltage (HV) region 14, a medium-voltage (MV) region 16, and a low-voltage (LV) region 18 are defined on the substrate 12, in which at least a HV device 114 is disposed on the HV region 14, a MV device 116 is disposed on the MV region 16, the LV region 18 could further include a core region and/or an input/output (I/O) region, and a LV device 118 is disposed on the LV region 18. Preferably, FIGS. 2-11 are cross-section views illustrating a method for fabricating the semiconductor device taken along the sectional line AA' of the HV region 14, the sectional line BB' of the MV region 16, and the sectional line CC' of the LV region 18.

It should be noted that a dummy region 120 could also be disposed between the HV region 14/MV region 16 and the LV region 18 and at least a dummy device 122 is disposed on the dummy region 120. Preferably, the dummy region 120 could be defined to surround the entire LV region 18 as shown in FIG. 1 or only disposed between the LV region 18 and the HV region 14/MV region 16 without surrounding the entire LV region 18. Due to the limitation of space while the dummy device 122 and the LV device 118 essentially share almost same structural feature if viewed from a cross-section perspective, the dummy device 122 on the dummy region 120 is omitted in the fabrication process shown in FIGS. 2-11.

In this embodiment, the three regions 14, 16, 18 could be transistor regions having same conductive type or different conductive types. For instance, each of the three regions 14, 16, 18 could be a PMOS region or a NMOS region and the three regions 14, 16, 18 are defined to fabricate gate structures having different threshold voltages in the later process. Preferably, it would be desirable to first conduct an implantation process to form p-type deep wells on the HV region 14 and MV region 16 and a n-type deep well on the LV region 18, but not limited thereto.

Next, bases 20, 22 are formed on the HV region 14 and MV region 16 and a plurality of fin-shaped structures 24 are formed on the substrate 12 of the LV region 18. Preferably, the bases 20, 22 and the fin-shaped structures 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the bases 20, 22 and the fin-shaped structures 24 could also be obtained by first forming a patterned mask (not shown) on the substrate, 12, and through an etching process, the pattern of the patterned mask is transferred to the substrate 12 to form the bases 20, 22 and the fin-shaped structures 24. Moreover, the formation of the bases 20, 22 and the fin-shaped structures 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding the bases 20, 22 and fin-shaped structures 24. These approaches for forming the bases 20, 22 and fin-shaped structures 24 are all within the scope of the present invention.

In this embodiment, a liner 26, a liner 28, and a hard mask 30 could be formed on each of the bases 20, 22 and the fin-shaped structures 24 during the aforementioned patterning process, in which the liner 26 preferably includes silicon oxide ($SiO_2$), the liner 28 includes silicon nitride (SiN), and the hard mask 30 includes silicon oxide ($SiO_2$), but not limited thereto.

Figure 3:
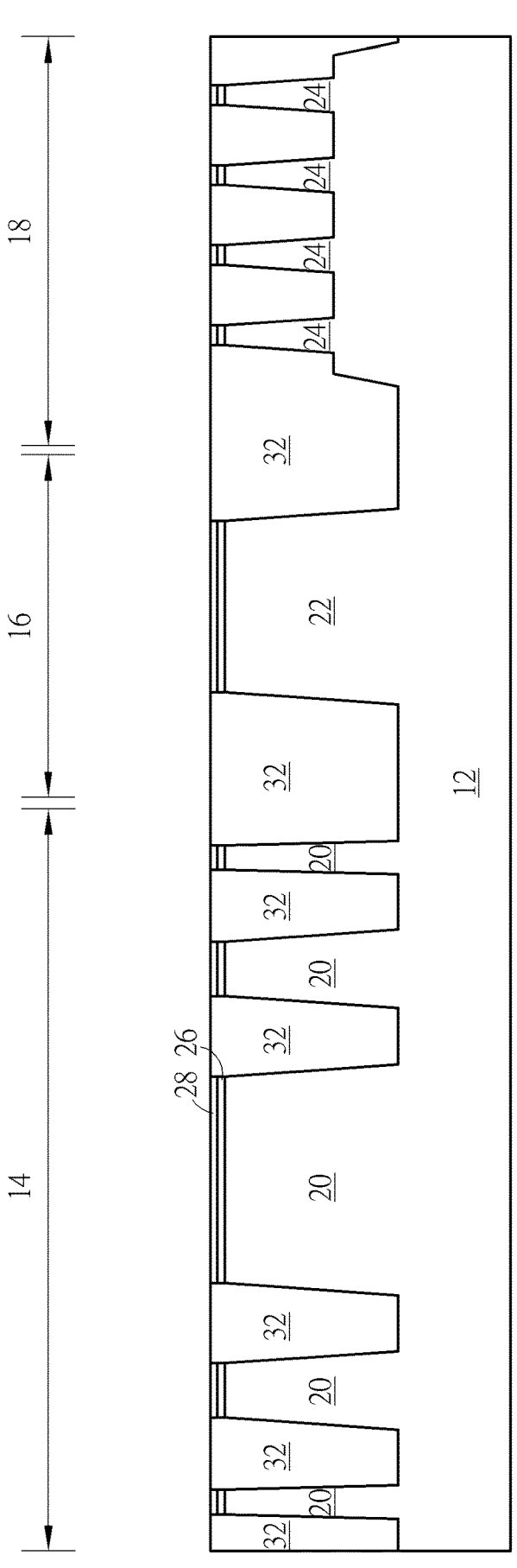

Next, as shown in FIG. 3, a flowable chemical vapor deposition (FCVD) process is conducted to form an insulating layer 32 made of silicon oxide on the bases 20, 22 and the fin-shaped structures 24 and filling the trenches between the bases 20, 22 and the fin-shaped structures 24, and a planarizing process such as chemical mechanical polishing (CMP) process is conducted to remove the hard mask 30 so that the top surfaces of the liner 28 and the insulating layer 32 are coplanar.

Figure 4:
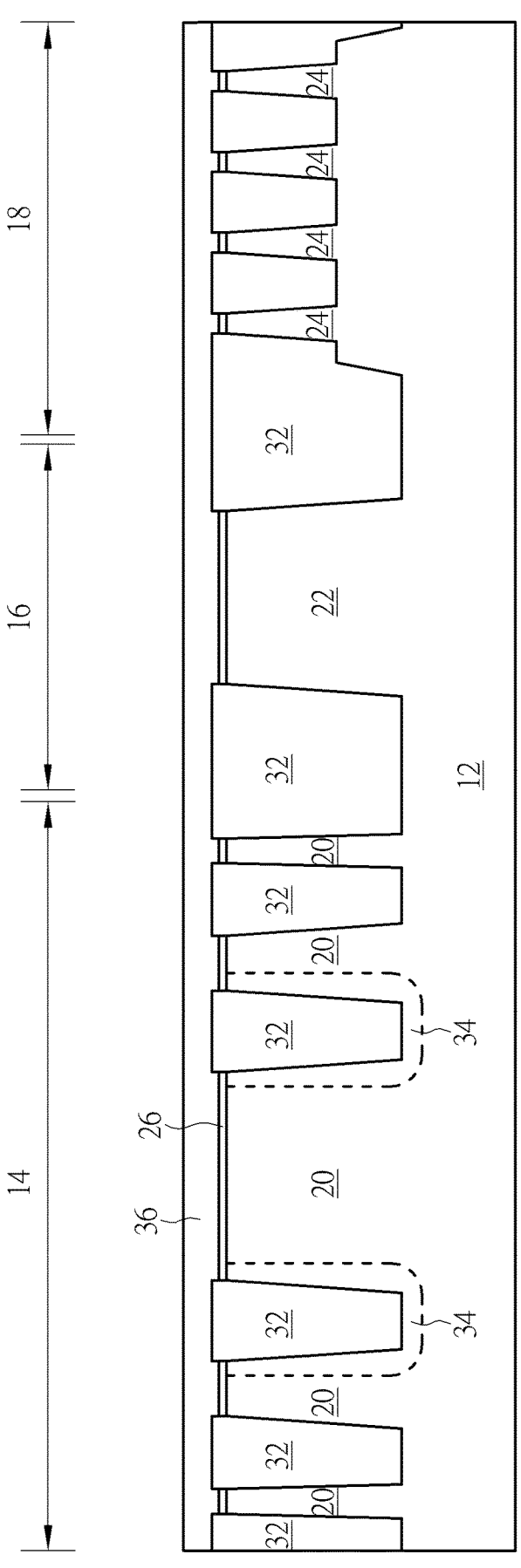

Next, as shown in FIG. 4, the liner 28 made of silicon oxide is removed through etching process to expose the liner 26 made of silicon nitride underneath. As a result, the top surface of the insulating layer 32 becomes slightly higher than the top surface of the liner 26 and at the same time forming recesses (not shown) directly above the liner 26. Next, an ion implantation process is conducted to form doped regions 34 in the base 20 on the HV region 14, in which the doped regions 34 preferably serve as lightly doped drains (LDDs) for the HV device 114 formed afterwards. Next, a hard mask 36 is formed on the bases 20, 22 and fin-shaped structures 24 on the HV region 14, the MV region 16, and the LV region 18 and filling the recesses above the liner 26. In this embodiment, the hard mask 36 is preferably made of SiN, but not limited thereto.

Figure 5:
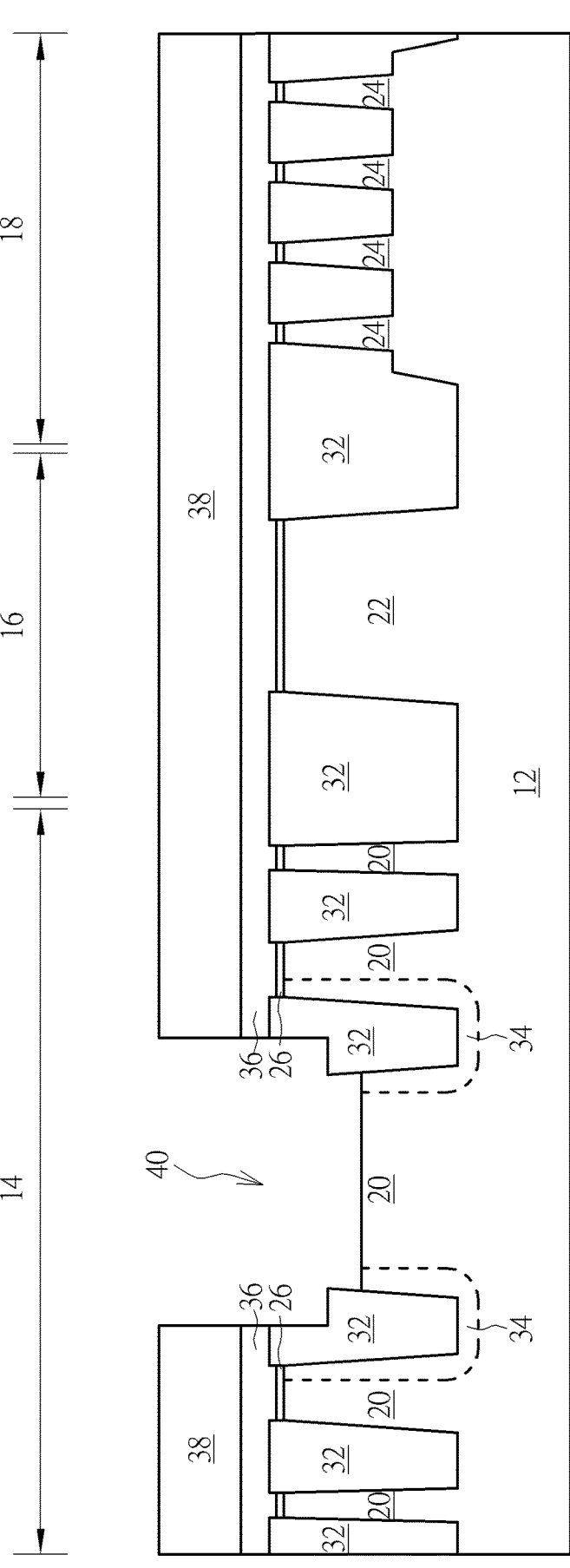

Next, as shown in FIG. 5, a patterned mask 38 such as a patterned resist is formed on the hard mask 36 on the MV region 16 and the LV region 18 as the patterned mask 38 includes an opening exposing the surface of the hard mask 36 on the HV region 14. Next, an etching process is conducted by using the patterned mask 38 as mask to remove part of the hard mask 36, part of the base 20, and part of the insulating layer 32 adjacent to two sides of the base 20 for forming a trench 40.

Figure 6:
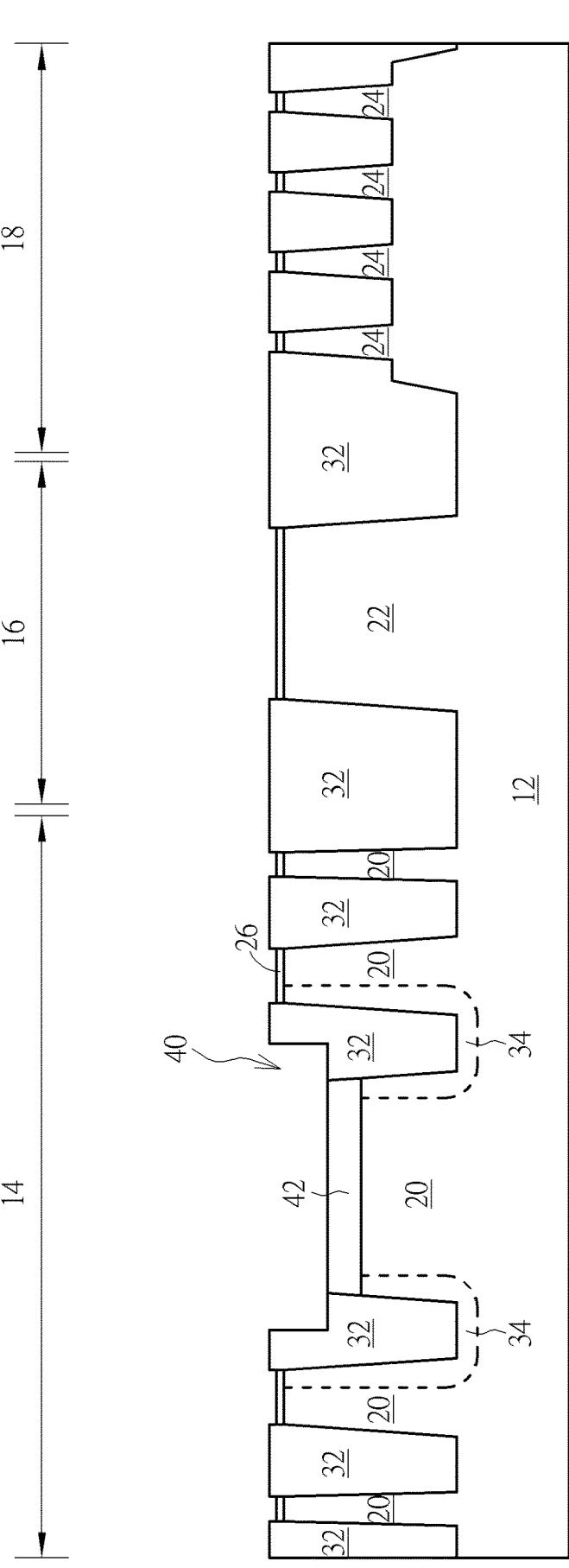

Next, after removing the patterned mask 38 as shown in FIG. 6, an oxide growth process or more specifically a rapid thermal oxidation (RTO) process is conducted to form a gate dielectric layer 42 made of silicon oxide on the base 20 on the HV region 14, and the hard mask 36 is completely removed thereafter. Preferably, the remaining trench 40 formed by the patterned mask 38 is adjacent to two sides of the gate dielectric layer 42 and the top surface of the gate dielectric layer 42 is lower than the top surface of the insulating layer 32 on both MV region 16 and LV region 18.

Next, another patterned mask (not shown) such as a patterned resist could be formed to cover the insulating layer 32 on the HV region 14 and MV region 16 as the patterned mask includes an opening exposing the top surface of the liner 26 and insulating layer 32 on the LV region 18, and then an ion implantation process is conducted to implant dopants into the fin-shaped structures 24 on the LV region 18 for adjusting threshold voltage (Vt) of the device. The patterned mask is then removed thereafter.

Figure 7:
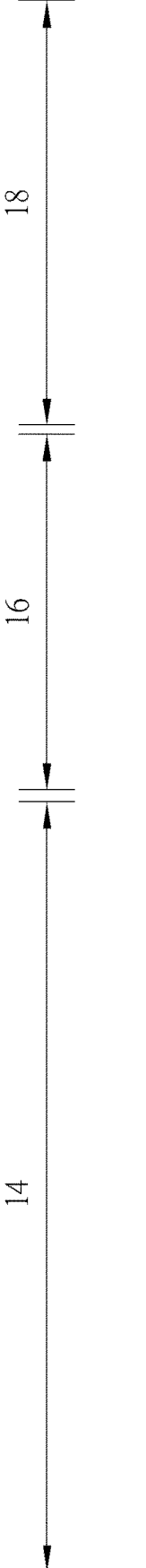
Figure 7:
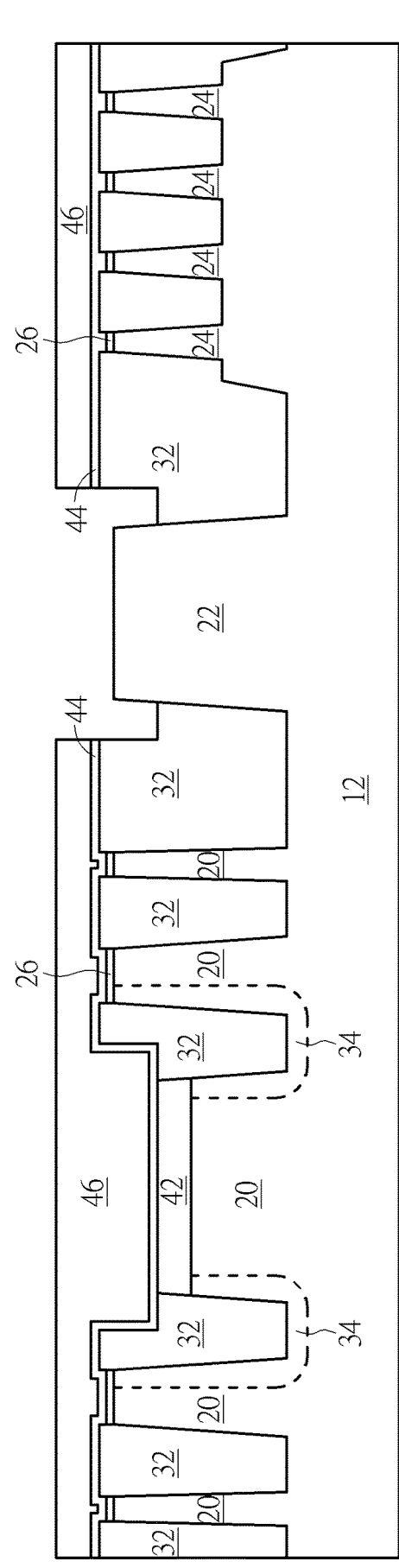

Next, as shown in FIG. 7, a hard mask 44 made of SiN is formed on the HV region 14, the MV region 16, and the LV region 18 including the gate dielectric layer 42 on the HV region 14, the base 24 on the MV region 16, and the fin-shaped structures 24 on the LV region 18, and then another patterned mask 46 such as a patterned resist is formed on the insulating layer 32 on the HV region 14 and LV region 18, in which the patterned mask 46 includes an opening exposing the hard mask 44 on the MV region 16. Next, an etching process is conducted by using the patterned mask 46 as mask to remove the hard mask 44, part of the insulating layer 32, the liner 26, and even part of the base 22 on the MV region 16 for exposing the surface of the base 22.

Figure 8:
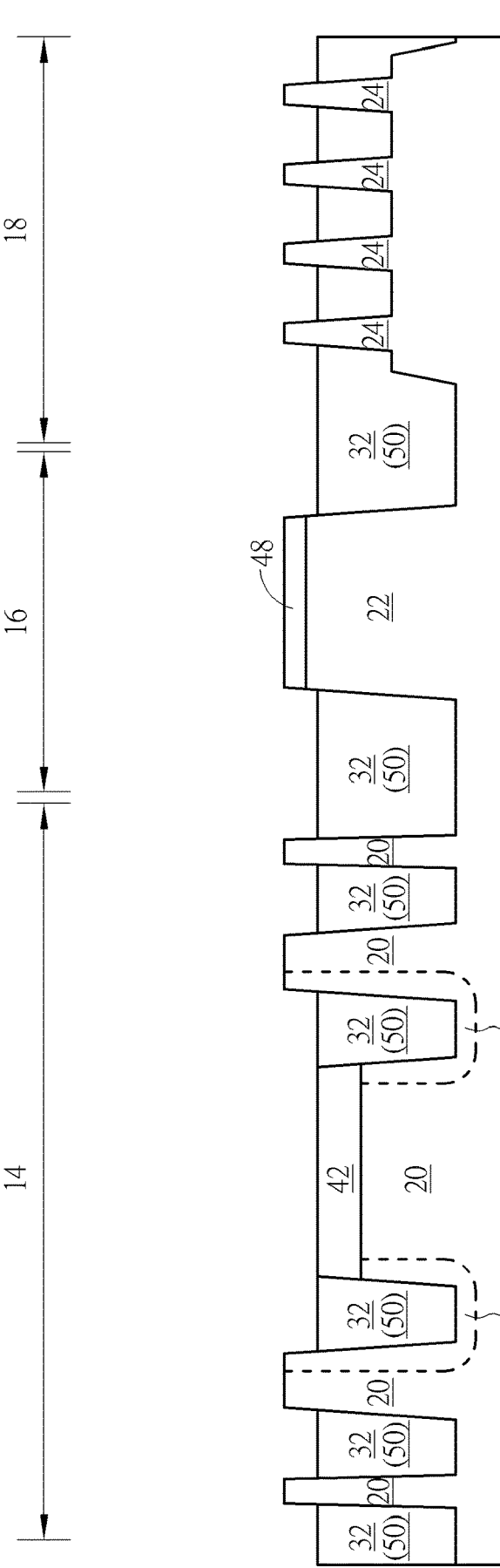

Next, as shown in FIG. 8, another oxide growth process such as a RTO process is conducted to form a gate dielectric layer 48 made of silicon oxide on the base 22 on MV region 16, in which the top surface of the gate dielectric layer 48 on the MV region 16 is higher than the top surface of the gate dielectric layer 42 on the HV region 14 while the thickness of the gate dielectric layer 42 on the HV region 14 is greater than the thickness of the gate dielectric layer 48 on the MV region 16. In this embodiment, the thickness of the gate dielectric layer 42 on the HV region 14 could be more than one time such as 1.5 times or even two times the thickness of the gate dielectric layer 48 on the MV region 16.

Next, the patterned mask 46 and remaining hard mask 44 on the HV region 14, MV region 16, and LV region 18 are removed, and an etching process is conducted to completely remove the liner 26 on the fin-shaped structures 24 on the LV region 14 for exposing the top surface of the fin-shaped structures 24 and also remove part of the insulating layer 32 on the HV region 14, MV region 16, and LV region 18 so that the top surface of the insulating layer 32 is slightly lower than the top surface of the bases 20, 22 and the fin-shaped structures 24 for forming a shallow trench isolation (STI) 50. It should be noted that at this stage, the top surface of the gate dielectric layer 42 on the HV region 14 is slightly lower than the top surface of the gate dielectric layer 48 on the MV region 16 and the top surface of the fin-shaped structures 24 on the LV region 18.

Figure 9:
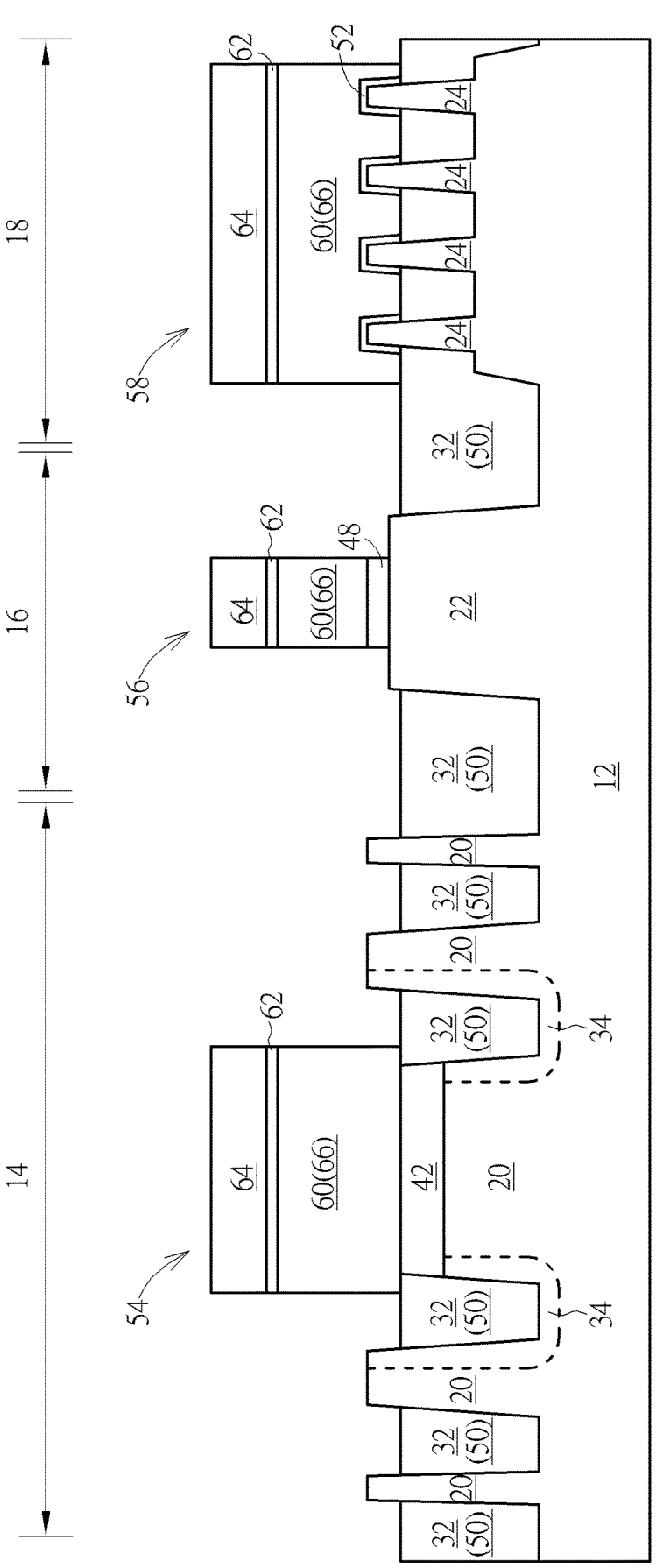

Next, as shown in FIG. 9, an oxidation process such as an in-situ steam generation (ISSG) process is conducted to form a gate dielectric layer 52 on the surface of fin-shaped structures 24 on the LV region 18. Next, gate structures 54, 56, 58, 124 or dummy gates could be formed on the bases 20, 22 and the fin-shaped structures 24 on the HV region 14, MV region 16, LV region 18, and the dummy region 120. It should be noted that since the gate structure 124 on the dummy region 120 and the gate structures 54, 56, 58 on other regions are fabricated through the same process, the details of which are not explained or shown in the following process for the sake of brevity. In this embodiment, the formation of the gate structures 54, 56, 58 could be accomplished by a gate first process, a high-k first approach from gate last process, or a high-k last approach from gate last process. Since this embodiment pertains to a high-k last approach, a gate material layer 60 preferably made of polysilicon, a hard mask 62 made of SiN, and a hard mask 64 made of silicon oxide could be formed sequentially on the gate dielectric layers 42, 48, 52, and a pattern transfer process is then conducted by using a patterned resist (not shown) as mask to remove part of the hard masks 62, 64 and part of the gate material layer 60 through single or multiple etching processes. After stripping the patterned resist, gate structures 54, 56, 58 composed of gate dielectric layers 42, 48, 52 respectively and patterned gate material layers 60 are formed on the substrate 12 on each region, in which the patterned gate material layer 60 becomes a gate electrode 66 on each region.

Next, at least a spacer (not shown) is formed on sidewalls of the gate structures 54, 56, 58. In this embodiment, the spacer could be a single spacer or a composite spacer, in which the spacer could further include an offset spacer (not shown) and a main spacer (not shown). The offset spacer and the main spacer are preferably made of different materials while the offset spacer and main spacer could all be selected from the group consisting of $SiO_2$, SiN, SiON, and SiCN, but not limited thereto.

Figure 10:
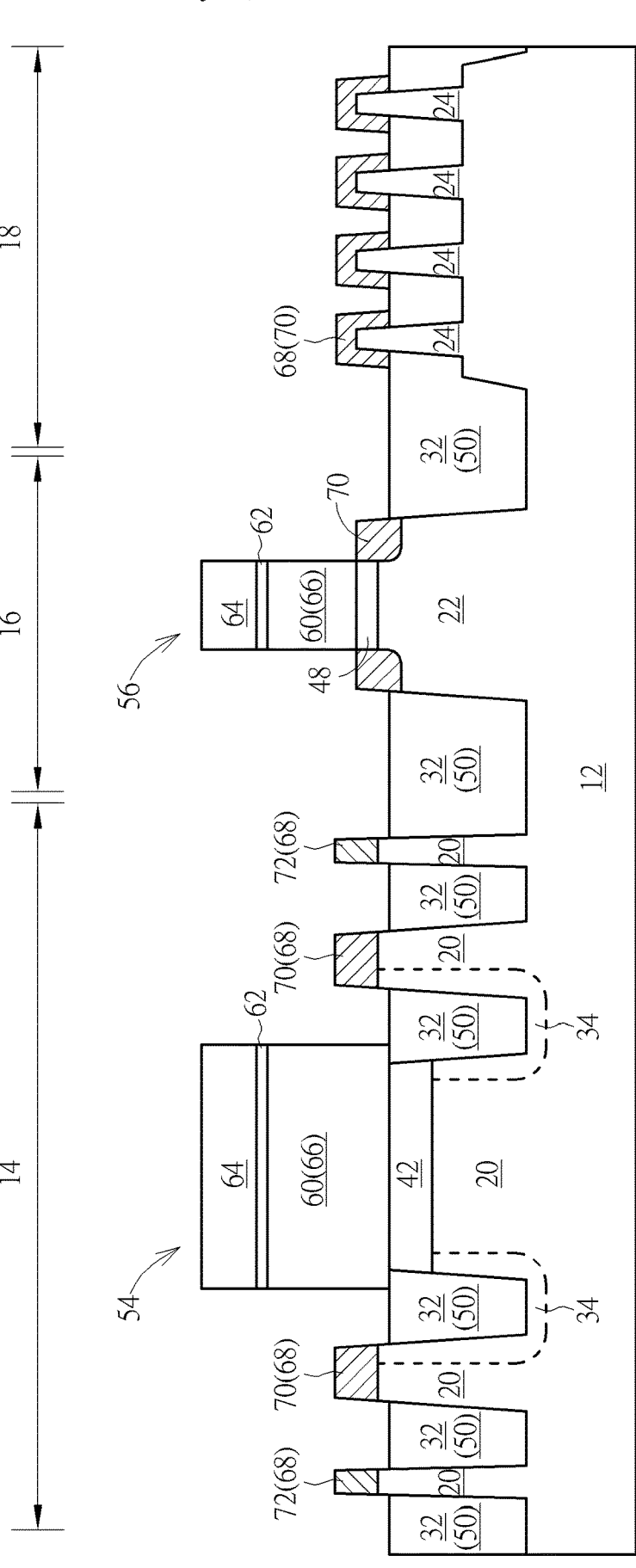

Referring to FIG. 10, FIG. 10 illustrates a method for fabricating a semiconductor device according to an embodiment of the present invention taken along the sectional line AA' of the HV region 14, the sectional line BB' of the MV region 16, and the sectional line DD' of the LV region 18. As shown in FIG. 10, one or more dry etching and/or wet etching process could be conducted by using the gate structures 54, 56, 58 and spacers on the HV region 14, the MV region 16, and the LV region 18 as mask to remove part of the substrate 12 for forming recesses (not shown) adjacent to two sides of the gate structures 54, 56, 58. Next, a selective epitaxial growth (SEG) process is conducted to form epitaxial layers 68 in the recesses.

As shown in the cross-section view of FIG. 10, the epitaxial layers 68 on the LV region 18 also share substantially same cross-section shape with the recesses. For instance, the cross-section of each of the epitaxial layers 68 could also include a circle, a hexagon, or an octagon depending on the demand of the product. In this embodiment, the epitaxial layers 68 could also be formed to include different materials depending on the type of transistor being fabricated. For instance, if the MOS transistor being fabricated were to be a PMOS transistor, the epitaxial layers 68 could be made of material including but not limited to for example SiGe, SiGeB, or SiGeSn. If the MOS transistor being fabricated were to be a NMOS transistor, the epitaxial layers 68 could be made of material including but not limited to for example SiC, SiCP, or SiP. Moreover, the SEG process could also be adjusted to form a single-layered epitaxial structure or multi-layered epitaxial structure, in which heteroatom such as germanium atom or carbon atom of the structure could be formed to have gradient while the surface of the epitaxial layers 68 is preferred to have less or no germanium atom at all to facilitate the formation of silicide afterwards.

Next, a photo-etching process could be conducted to remove part of the gate dielectric layer 48 on the MV region 16 for exposing the surface of the base 22 adjacent to two sides of the gate structure 56, and then one or more ion implantation process is conducted to form source/drain regions 70 in the bases 20, 22 adjacent to two sides of the gate structures 54, 56 on the HV region 14 and MV region 16 and at the same time form doped regions serving as an electrostatic discharge (ESD) protection ring 72 in the base 20 around the HV device 114 on the HV region 14. Preferably, the source/drain regions 70 and the ESD protection ring 72 on the HV region 14 include dopants of different conductive type. For instance, either one of the source/drain regions 70 and the ESD protection ring 72 could include n-type dopants while the other include p-type dopants.

According to an embodiment of the present invention, it would also be desirable to form source/drain regions 70 in part or all of the epitaxial layers 68 on the LV region 18. According to another embodiment of the present invention, the source/drain regions 70 could also be formed insitu during the SEG process. For instance, the source/drain regions 70 could be formed by implanting p-type dopants during formation of a SiGe epitaxial layer, a SiGeB epitaxial layer, or a SiGeSn epitaxial layer for PMOS transistor, or could be formed by implanting n-type dopants during formation of a SiC epitaxial layer, SiCP epitaxial layer, or SiP epitaxial layer for NMOS transistor. By doing so, it would be desirable to eliminate the need for conducting an extra ion implantation process for forming the source/drain regions 70. Moreover, the dopants within the source/drain regions 70 could also be formed with a gradient, which is also within the scope of the present invention.

Figure 11:
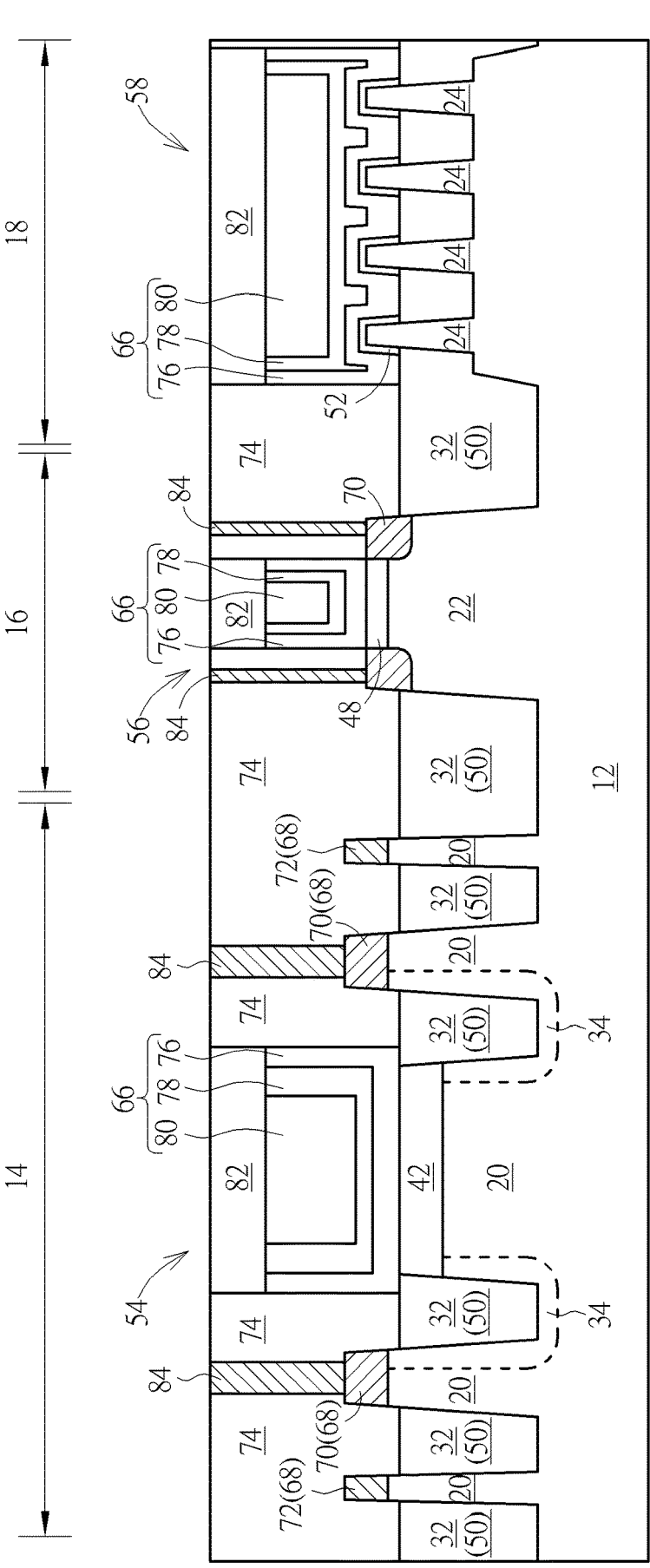

Next, as shown in FIG. 11, a selective contact etch stop layer (CESL) (not shown) could be formed on the substrate 12 surface to cover the gate structures 54, 56, 58 on the HV region 14, MV region 16, and LV region 18, and an interlayer dielectric (ILD) layer 74 is formed on the CESL afterwards. Next, a planarizing process such as a chemical mechanical polishing (CMP) process is conducted to remove part of the ILD layer 74 and part of the CESL so that the top surfaces of the hard mask 64 and ILD layer 74 are coplanar.

Next, a replacement metal gate (RMG) process is conducted to transform the gate structures 54, 56, 58 on the HV region 14, MV region 16, and LV region 18 into metal gates. For instance, the RMG process could be accomplished by first performing a selective dry etching or wet etching process using etchants including but not limited to for example ammonium hydroxide ($NH_4OH$) or tetramethylammonium hydroxide (TMAH) to remove the hard masks 62, 64 and the gate material layers 60 from gate structures 54, 56, 58 for forming recesses (not shown) in the ILD layer 74. Next, a high-k dielectric layer 76, a work function metal layer 78, and a low resistance metal layer 80 are formed in the recesses, and a planarizing process such as CMP is conducted to remove part of low resistance metal layer 80, part of work function metal layer 78, and part of high-k dielectric layer 76 to form metal gates. Preferably, the high-k dielectric layer 76, the work function metal layer 78, and the low resistance metal layer 80 altogether constitute the gate electrode 66 of each of the transistors or devices.

In this embodiment, the high-k dielectric layer 76 is preferably selected from dielectric materials having dielectric constant (k value) larger than 4. For instance, the high-k dielectric layer 46 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 78 is formed for tuning the work function of the metal gate in accordance with the conductivity of the device. For an NMOS transistor, the work function metal layer 78 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 78 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 78 and the low resistance metal layer 50 may include titanium (Ti), titanium nitride (TiN), tantalum (Ta) or tantalum nitride (TaN). Furthermore, the material of the low-resistance metal layer 80 may include copper (Cu), aluminum (Al), titanium aluminum (TiAl), cobalt tungsten phosphide (CoWP) or any combination thereof. Since the transformation of dummy gates into metal gates through RMG process is well known to those skilled in the art, the details of which are not explained herein for the sake of brevity. Next, part of the high-k dielectric layer 76, part of the work function metal layer 78, and part of the low resistance metal layer 80 are removed to form recesses (not shown), and a hard mask 82 is formed into each of the recesses so that the top surfaces of the hard masks 82 and the ILD layer 74 are coplanar. Preferably the hard masks 82 could include $SiO_2$, SiN, SiON, SiCN, or combination thereof.

Next, a photo-etching process is conducted by using a patterned mask (not shown) as mask to remove part of the ILD layer 74 and part of the CESL adjacent to the gate structures 54, 56, 58 for forming contact holes (not shown) exposing the source/drain regions 70 underneath. Next, conductive materials including a barrier layer selected from the group consisting of titanium (Ti), titanium nitride (TiN), tantalum (Ta), and tantalum nitride (TaN) and a metal layer selected from the group consisting of tungsten (W), copper (Cu), aluminum (Al), titanium aluminide (TiAl), and cobalt tungsten phosphide (CoWP) are deposited into the contact holes, and a planarizing process such as CMP is conducted to remove part of aforementioned barrier layer and low resistance metal layer for forming contact plugs 84 electrically connecting the source/drain regions 70. This completes the fabrication of a semiconductor device according to an embodiment of the present invention.

Referring again to FIGS. 1 and 11, FIGS. 1 and 11 illustrate structural views of a semiconductor device according to an embodiment of the present invention. As shown in FIGS. 1 and 11, the semiconductor device includes a substrate having a HV region 14, a MV region 16, and a LV region 18, a HV device 114 disposed on the HV region 14, a MV device 116 disposed on the MV region 16, and a LV device 118 disposed on the LV region 18, an ESD protection ring 72 surrounding the HV device 114, and a STI 50 around the HV device 114, MV device 116, and LV device 118. Preferably, the HV device 114 includes a base 20 disposed on the substrate 12, a gate dielectric layer 42 disposed on the base 20, a gate electrode 66 made of high-k dielectric layer 76, work function metal layer 78, and low resistance metal layer 80 disposed on the gate dielectric layer 42, and source/drain regions 70 disposed in the base 20 adjacent to two sides of the gate electrode 66.

The MV device 116 includes a base 22 disposed on the substrate 12, a gate dielectric layer 48 disposed on the base 22, a gate electrode 66 made of high-k dielectric layer 76, work function metal layer 78, and low resistance metal layer 80 disposed on the gate dielectric layer 48, and source/drain regions 70 disposed in the base 22 adjacent to two sides of the gate electrode 66. The LV device 118 includes a plurality of fin-shaped structures 24 disposed on the substrate 12, a gate dielectric layer 52 disposed on the fin-shaped structures 24, a gate electrode 66 made of high-k dielectric layer 76, work function metal layer 78, and low resistance metal layer 80 disposed on the gate dielectric layer 52, and source/drain regions 70 disposed in the fin-shaped structures 24 adjacent to two sides of the gate electrode 66.

Viewing from a more detailed perspective, the top surface of the gate electrode 66 on the HV region 14 is even with the top surface of the gate electrodes 66 on the MV region 16 and LV region 18, the top surface of the gate dielectric layer 42 on HV region 14 is lower than the top surface of the gate dielectric layer 48 on the MV region 16 and the top surface of the fin-shaped structures 24 on the LV region 18 but even within the top surface of the STI 50, the top surface of the gate dielectric layer 48 on the MV region 16 is even with the top surface of the fin-shaped structures 24 on the LV region 18, the top surface of the gate dielectric layer 52 on the LV region 18 could be slightly higher than the top surface of the gate dielectric layer 48 on the MV region 16, the top surface of the source/drain region 70 on the HV region 14 is even with the top surface of the fin-shaped structures 24 on the LV region, and the top surface of the ESD protection ring 72 is even with the top surfaces of the source/drain region 70 on the HV region 14.

Figure 12:
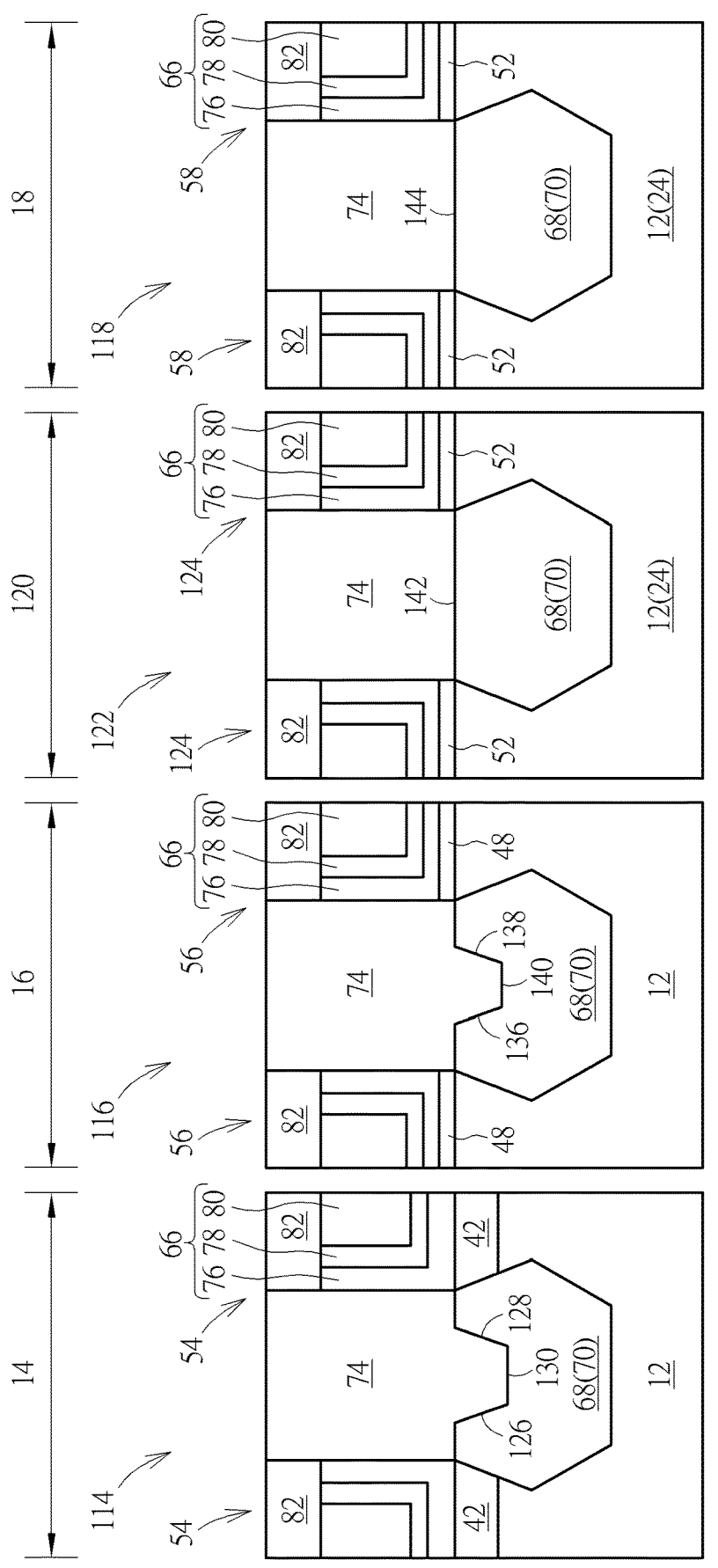
FIGS. 12-13 illustrate enlarged views of using selective epitaxial growth process to form epitaxial layers on the HV region, the MV region, the dummy region, and the LV region according to an embodiment of the present invention.
Figure 13:
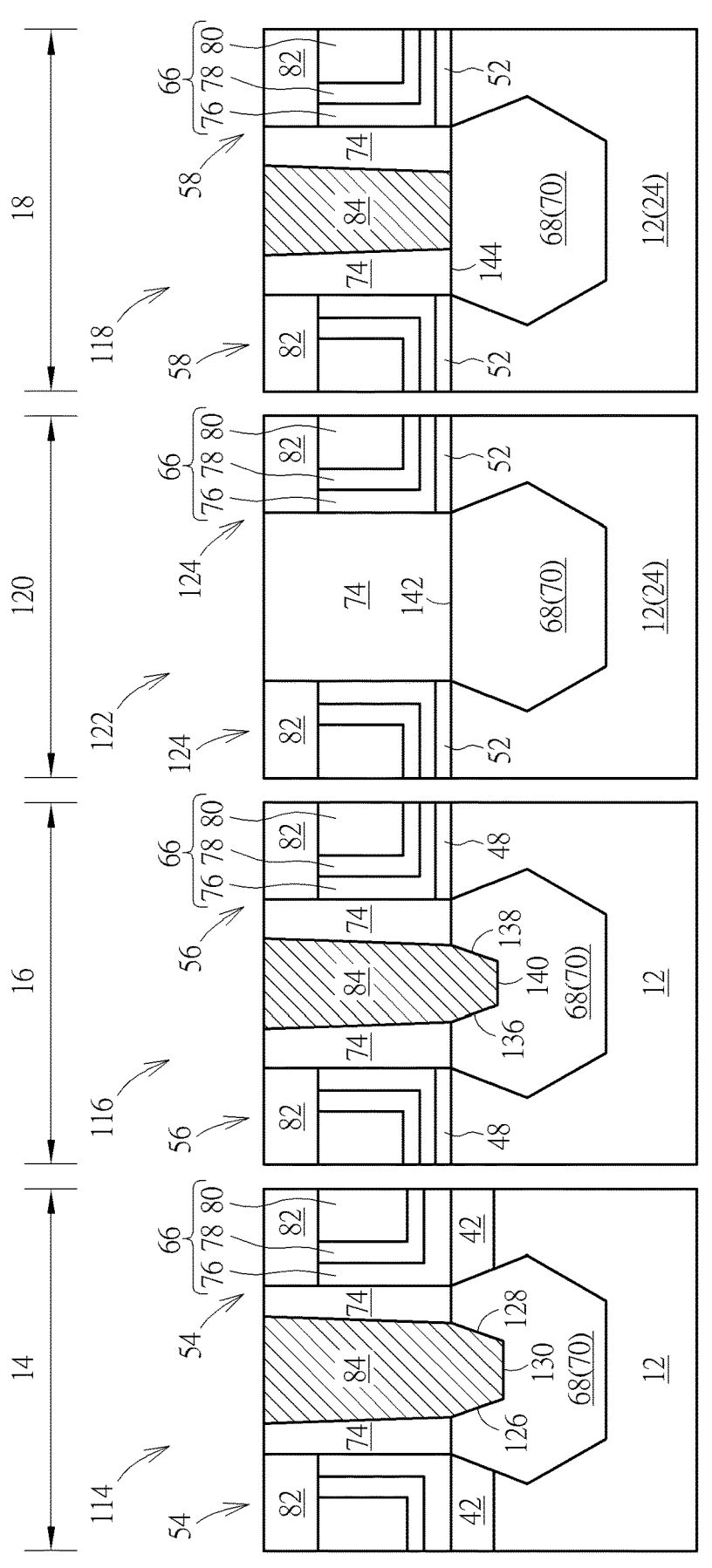

Referring to FIGS. 12-13, FIGS. 12-13 illustrate enlarged views of using selective epitaxial growth process to form epitaxial layers 68 on the HV region 14, the MV region 16, the dummy region 120, and the LV region 18, in which FIG. 12 illustrates a structural view after transforming polysilicon gates into metal gates but before formation of contact plugs while FIG. 13 illustrate a structural view after formation of contact plugs. It should be noted even though only a single gate structure is formed on each of the HV region 14, the MV region, 16, and the LV region 18 as shown in the top view of FIG. 1, portion of gate structures adjacent to two sides of each epitaxial layer 68 is depicted in FIG. 12 to further emphasize the overall profile of the epitaxial layers on each region.

As shown in FIG. 12, the HV device 114 on the HV region 14 includes gate structures 54 disposed on the substrate 12 and an epitaxial layer 68 adjacent to the gate structures 54, in which a top surface of the epitaxial layer 68 includes a first V-shape. Specifically, the first V-shape of the epitaxial layer 68 on the HV region 14 includes a first inclined sidewall 126, a second inclined sidewall 128, and a planar surface 130 connecting the first inclined sidewall 126 and the second inclined sidewall 128 and before forming contact plugs 84, all of the first inclined sidewall 126, the second inclined sidewall 128, and the planar surface 130 contact the ILD layer 74 directly.

The MV device 116 on the MV region 16 includes a gate structures 56 disposed on the substrate 12 and an epitaxial layer 68 adjacent to the gate structures 56, in which a top surface of the epitaxial layer 68 includes a second V-shape. Similar to the epitaxial layer 68 on the HV region 14, the second V-shape of the epitaxial layer 68 on the MV region 16 includes a third inclined sidewall 136, a fourth inclined sidewall 138, and a planar surface 140 connecting the third inclined sidewall 136 and the fourth inclined sidewall 138 and before forming the contact plugs 84, all of the third inclined sidewall 136, the fourth inclined sidewall 138, and the planar surface 140 contact the ILD layer 74 directly.

It should be noted that since the pitch of each of the gate structures 56 disposed on the MV region 16 is less than the pitch of each of the gate structures 54 disposed on the HV region 14 while the size of the epitaxial layer 68 of the MV device 116 is less than size of the epitaxial layer 68 of the HV device 114, the planar surface 140 of the epitaxial layer 68 of the MV device 116 could be even with or slightly higher than the planar surface 130 of the epitaxial layer 68 of the HV device 114 and the bottom surface of the epitaxial layer 68 of the MV device 116 could also be even with or slightly higher than the bottom surface of the epitaxial layer 68 of the HV device 114.

The dummy device 122 on the dummy region 120 includes gate structures 124 disposed on the substrate 12 and an epitaxial layer 68 adjacent to the gate structures 124. Viewing from the top view shown in FIG. 1, despite the fin-shaped structures 24 and the gate structure 124 of the dummy device 122 on the dummy region 120 are disposed according to a ring-shape around the LV device 118 on the LV region 18, according to other embodiment of the present invention, the dummy device 122 could also be shaped as a barrier wall to be only disposed between the HV region 14 and LV region 18 or between the MV region 16 and the LV region 18 without surrounding the entire LV device 118, which is also within the scope of the present invention.

The LV device 118 on the LV region 18 includes gate structures 58 disposed on the substrate 12 and an epitaxial layer 68 adjacent to the gate structure 58, in which the top surface of the epitaxial layer 68 includes a planar surface 144, the planar surface 144 could be even with or slightly higher than the top surface of the substrate 12 or fin-shaped structures 24, and the planar surface 130 of the epitaxial layer 68 on the HV region 14 and the planar surface 140 of the epitaxial layer 68 on the MV region 16 are preferably lower than the planar surface 142 on the dummy region 120 and the planar surface 144 on the LV region 18.

Overall, the gate structure 124 of the dummy device 122 and the gate structure 58 of the LV device 118 are both made of metal gates thereby having same structures, in which the top surface of the epitaxial layer 68 of the dummy device 122 includes a planar surface 142, the top surface of the epitaxial layer 68 of the LV device 118 includes a planar surface 144, the planar surface 142 of the dummy device 122 is even with the planar surface 144 of the LV device 118, and both planar surfaces 142 and 144 contact the ILD layer 74 directly before the contact plugs 84 are formed. It should also be noted that even though the two planar surfaces 142 and 144 are even with the surface of the substrate 12 and/or fin-shaped structure 24 in this embodiment, according to other embodiment of the present invention the two planar surfaces 142 and 144 could also be slightly higher than the surface of the substrate 12 or fin-shaped structure 24.

As shown in FIG. 13, after the contact plugs 84 are formed, the contact plug 84 of the HV device 114 preferably contacts the first inclined sidewall 126, the second inclined side wall 128, and the planar surface 130 directly, the contact plug 84 of the MV device 116 contacts the third inclined sidewall 136, the fourth inclined sidewall 138, and the planar surface 140 directly, and the contact plug 84 of the LV device 118 contacts the planar surface 144 directly.

In contrast to the LV device 118 includes a contact plug 84 connecting the epitaxial layer 68 and the source/drain region 70, the dummy device 122 includes no contact plug for connecting the epitaxial layer 68 and the source/drain region 70. In other word, the top surface of the epitaxial layer 68 and/or source/drain region 70 of the dummy device 122 preferably contacts the ILD layer 74 directly instead of any contact plug or any other external circuits. Specifically, the epitaxial layer 68 and/or source/drain region 70 of the dummy device 122 is a floating region not connected to any conductive plug or external connection.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a substrate having a high-voltage (HV) region, a low-voltage (LV) region, and a dummy region between the HV region and the LV region;
   forming a HV device on the HV region, wherein the HV device comprises:
   a first gate structure on the substrate; and
   a first epitaxial layer adjacent to the first gate structure, wherein a top surface of the first epitaxial layer comprises a first V-shape;
   forming a LV device on the LV region, wherein the LV device comprises:
   a second gate structure on the substrate; and
   a second epitaxial layer adjacent to the second gate structure, wherein a top surface of the second epitaxial layer comprises a first planar surface; and
   forming a dummy device on the dummy region, wherein the dummy region comprises a ring shape around the LV region.

2. The method of claim 1, wherein the first epitaxial layer comprises:
   a first inclined sidewall;
   a second inclined sidewall; and
   a second planar surface connecting the first inclined sidewall and the second inclined sidewall.

3. The method of claim 2, wherein the second planar surface is lower than the first planar surface.

4. The method of claim 1, wherein the substrate comprises a medium-voltage (MV) region, the method comprising:
   forming a MV device on the MV region, wherein the MV device comprises:
   a third gate structure on the substrate; and
   a third epitaxial layer adjacent to the third gate structure, wherein a top surface of the third epitaxial layer comprises a second V-shape.

5. The method of claim 4, wherein the third epitaxial layer comprises:

a third inclined sidewall;

a fourth inclined sidewall; and a third planar surface connecting the third inclined sidewall and the fourth inclined sidewall.

6. The method of claim 5, wherein the third planar surface is lower than the first planar surface.

7. The method of claim 1, wherein the substrate comprises the dummy region between the HV region and the LV region, the method comprising:

forming the dummy device on the dummy region, wherein the dummy device comprises:

a fourth gate structure on the substrate; and a fourth epitaxial layer adjacent to the fourth gate structure.

8. A semiconductor device, comprising:

a substrate having a high-voltage (HV) region, a low-voltage (LV) region, and a dummy region between the HV region and the LV region;

a HV device on the HV region, wherein the HV device comprises:

a first gate structure on the substrate; and a first epitaxial layer adjacent to the first gate structure, wherein a top surface of the first epitaxial layer comprises a V-shape;

a LV device on the LV region, wherein the LV device comprises:

a second gate structure on the substrate; and a second epitaxial layer adjacent to the second gate structure, wherein a top surface of the second epitaxial layer comprises a first planar surface; and a dummy device on the dummy region, wherein the dummy device comprises:

a fourth gate structure on the substrate; and a fourth epitaxial layer adjacent to the fourth gate structure.

9. The semiconductor device of claim 8, wherein the first epitaxial layer comprises:

a first inclined sidewall;

a second inclined sidewall; and a second planar surface connecting the first inclined sidewall and the second inclined sidewall.

10. The semiconductor device of claim 9, wherein the second planar surface is lower than the first planar surface.

11. The semiconductor device of claim 8, wherein the substrate comprises a medium-voltage (MV) region, the method comprising:

a MV device on the MV region, wherein the MV device comprises:

a third gate structure on the substrate; and a third epitaxial layer adjacent to the third gate structure, wherein a top surface of the third epitaxial layer comprises a second V-shape.

12. The semiconductor device of claim 11, wherein the third epitaxial layer comprises:

a third inclined sidewall;

a fourth inclined sidewall; and a third planar surface connecting the third inclined sidewall and the fourth inclined sidewall.

13. The semiconductor device of claim 12, wherein the third planar surface is lower than the first planar surface.

14. The semiconductor device of claim 8, wherein the dummy region comprises a ring shape around the LV region.

* * * * *